(12) United States Patent
Kirn

(10) Patent No.: US 7,132,886 B2
(45) Date of Patent: Nov. 7, 2006

(54) DETECTING LOAD CURRENT IN MULTI-REFERENCE AMPLIFIERS

(75) Inventor: Larry Kirn, East Lansing, MI (US)

(73) Assignee: JAM Technologies, Inc., Boston, MA (US)

( * ) Notice: Subject to any disclaimer, the term of this patent is extended or adjusted under 35 U.S.C. 154(b) by 107 days.

(21) Appl. No.: 10/916,037

(22) Filed: Aug. 11, 2004

(65) Prior Publication Data

US 2005/0068108 A1 Mar. 31, 2005

Related U.S. Application Data

(60) Provisional application No. 60/494,240, filed on Aug. 11, 2003.

(51) Int. Cl.
*H03F 3/217* (2006.01)
*H03F 1/52* (2006.01)

(52) U.S. Cl. ..................................... 330/251; 330/298

(58) Field of Classification Search ............ 330/207 A, 330/207 P, 251, 298
See application file for complete search history.

(56) References Cited

U.S. PATENT DOCUMENTS

| | | | |
|---|---|---|---|
| 6,005,316 A | * | 12/1999 | Harris ........................ 310/90.5 |
| 6,259,317 B1 | * | 7/2001 | Melanson ..................... 330/10 |
| 6,535,058 B1 | | 3/2003 | Kirn ........................... 330/10 |

FOREIGN PATENT DOCUMENTS

WO WO 00/28658 5/2000

* cited by examiner

*Primary Examiner*—Steven J. Mottola
(74) *Attorney, Agent, or Firm*—Gifford, Krass, Groh, Sprinkle, Anderson & Citkowski, PC

(57) ABSTRACT

A method and apparatus are disclosed for inferring amplifier load current from an internal control voltage governing a reference voltage in a multi-reference amplifier. Multi-reference amplifiers typically use internally-regulated references for application to the output stage. In that the output devices of these regulators exhibit limited gain or transconductance, internal voltage variances can be observed as a function of reference load current. This invention solves such problem at negligible additional cost.

4 Claims, 1 Drawing Sheet

DETECTING LOAD CURRENT IN MULTI-REFERENCE AMPLIFIERS

REFERENCE TO RELATED APPLICATION

This application claims priority from U.S. Provisional Patent Application Ser. No. 60/494,240, filed Aug. 11, 2003, the entire content of which is incorporated herein by reference.

FIELD OF THE INVENTION

This invention relates generally to multi-reference switching amplifiers and, in particular, to a cost-effective method to detect output current in such amplifiers.

BACKGROUND OF THE INVENTION

Multi-Reference Switching Amplifiers, of the type shown in U.S. Pat. No. 6,535,058 and PCT/US99/26691, the content of these being incorporated herein by reference, yield significantly higher instantaneous resolution than standard switching amplifiers. Such amplifiers are, however, no less susceptible to output faults than other switching amplifiers, and can as well benefit from output current feedback. However, a need exists for a cost-effective method to detect output current and correct faults in a multi-reference amplifier.

SUMMARY OF THE INVENTION

The present invention resides in a method and apparatus for inferring amplifier load current from an internal control voltage governing a reference voltage in a multi-reference amplifier. Multi-reference amplifiers typically use internally-regulated references for application to the output stage. In that the output devices of these regulators exhibit limited gain or transconductance, internal voltage variances can be observed as a function of reference load current. This invention solves such problem at negligible additional cost.

DETAILED DESCRIPTION OF THE INVENTION

Figure 1:
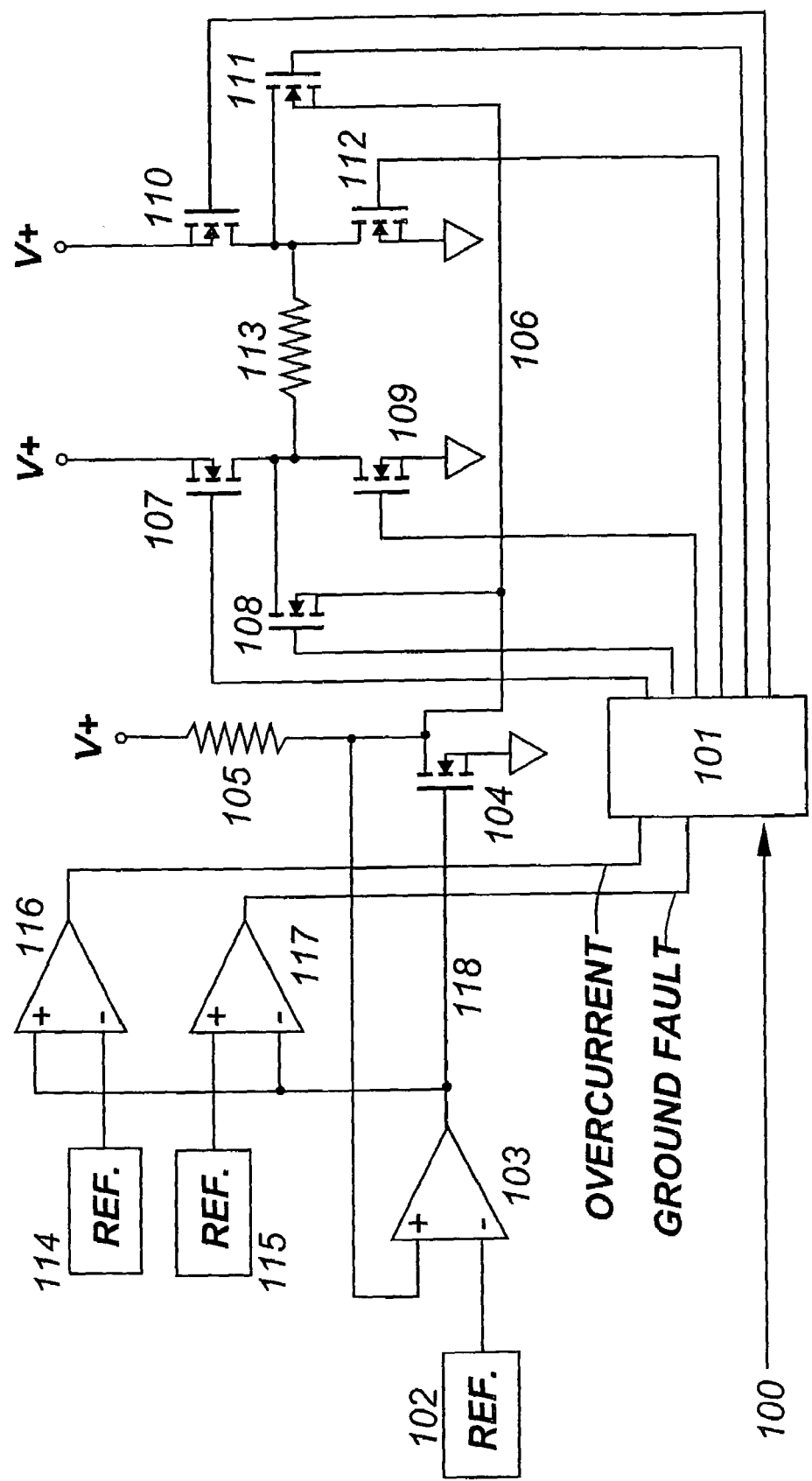
FIG. 1 is a circuit diagram depicting a preferred embodiment of the invention.

FIG. 1 is a circuit diagram depicting a preferred embodiment of the invention. Incoming data stream 100 is applied to modulator 101, which provides switching control signals to switching devices 107, 108, 109, 110, 111, and 112, the outputs of which are in turn coupled to load 113. Note that switching devices 107 and 110 selectively connect the load 113 to the V+ reference voltage, and that switching devices 108 and 111 selectively connect the load 113 to a lower reference voltage 106. Switching devices 109 112 selectively connect the load 113 to ground. Details of a such representative multi-reference amplifier can be found in the PCT application noted above, the entire content of which is incorporated herein by reference.

Voltage reference 106 is sourced by resistor 105 and regulated by transistor 104, under control of control voltage 118 from amplifier 103. Amplifier 103 generates control voltage 118 as a function of the difference between a reference 102 and the eventual output reference voltage 106. Connected in this fashion, the high-current output reference voltage 106 is regulated to approach the value of the reference 102.

Note that conditions which increase reference 106 will cause control voltage 118 to rise as well, in an effort to reduce voltage 106. Conversely, conditions which decrease reference 106 will cause control voltage 118 to fall, by the same effort.

Reference 114 outputs a voltage known to be higher than that expected of voltage 118 during normal amplifier operation. Reference 115 outputs a voltage known to be lower than that expected of voltage 118 during normal amplifier operation. Comparator 116 compares said control voltage 118 with reference 114, and outputs a high logic condition to modulator 101 in the event that voltage 118 becomes higher than expected. Presence of this high logic condition from comparator 116 then indicates that reference voltage 106 has been raised by abnormal conditions. Comparator 117 compares said control voltage 118 with reference 115, and outputs a high logic condition to modulator 101 in the event that voltage 118 becomes lower than expected. Presence of this high logic condition from comparator 117 then indicates that reference voltage 106 has been lowered by abnormal conditions.

From the patent references incorporated above, it is known that a V+ switching device 107 or 110 will be alternately activated with a ground switching device 109 or 113 on one side of load 113. Concurrently, a switching device 108 or 111 will be alternately activated with a ground-switching device 109 or 113 on the opposite side of load 113. Switched in this manner, it can be seen that excessively low values (such as a short circuit) of load 113 will cause reference voltage 106 to rise from current sourced by either switching device 107 or 110. It can also be seen that a short circuit to ground on either side of load 113 will result in lowered reference voltage 106 when the reference switching devices 108 or 111 of the shorted side of load 113 are alternately activated with ground switching devices 109 or 112. In that excessive voltage 106 is then caused by an overcurrent condition, the output of Comparator 116, which detects such as described above, is labeled 'Overcurrent'. In that inadequate voltage 106 is then caused by low impedance from one side of load 113 to ground, the output of Comparator 117, which detects such as described above, is labeled 'Ground Fault'.

In that the fault detection method described herein operates only as the amplifier is active, it is expected that positive and negative deviations of control voltage 118 can as well be used for detection, obviating references 114 and 115. This assumes that the amplifier is protected against DC output.

By this method described herein, it can be seen that the output current of a multi-reference amplifier can detected with reasonable accuracy, and that this detection can be used to protect the output stage from the most common load faults with negligible additional cost. Although use of static comparison references are shown, use of the current invention with dynamic references, which detect changes in load current, are also anticipated. Also, for simplicity, the preferred embodiment shown discloses use of separate reference generation circuitry. Use of the current invention with alternative multi-reference amplifier topologies which may integrate reference regulation are anticipated as well.

I claim:

1. A method of improving the performance of a multi-reference amplifier of the type wherein first gated switches on both sides of a load connect the load to a first reference voltage, and second gated switches, also on both sides of the load, connect the load to a second reference, the method comprising the steps of:

detecting the output current of the amplifier by comparing the second reference to a fixed voltage; and using this detection to protect the output stage from load faults.

2. The method of claim 1, further including the steps of:

comparing the second reference to a high reference voltage; and generating an over-current signal if the second reference exceeds the high reference voltage.

3. The method of claim 1, further including the steps of:

comparing the second reference to a low reference voltage; and generating a ground fault signal if the second reference falls below the low reference voltage.

4. The method of claim 1, wherein the second reference is static or dynamic.

* * * * *